(12) United States Patent
Miyazaki (10) Patent No.: US 10,418,101 B1
(45) Date of Patent: Sep. 17, 2019

(54) SEMICONDUCTOR MEMORY DEVICE AND METHOD OF CONTROLLING THE SAME

(71) Applicant: TOSHIBA MEMORY CORPORATION, Minato-ku, Tokyo (JP)

(72) Inventor: Takayuki Miyazaki, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/039,786

(22) Filed: Jul. 19, 2018

(30) Foreign Application Priority Data

Mar. 20, 2018 (JP) .................................. 2018-053060

(51) Int. Cl.
*G11C 13/00* (2006.01)
*G11C 11/36* (2006.01)

(52) U.S. Cl.
CPC ............ *G11C 13/004* (2013.01); *G11C 11/36* (2013.01); *G11C 2013/0045* (2013.01); *G11C 2013/0054* (2013.01)

(58) Field of Classification Search
CPC .................. G11C 11/1675; G11C 13/0069
USPC ................................................ 365/148, 158
See application file for complete search history.

(56) References Cited

U.S. PATENT DOCUMENTS

| 6,483,740 | B1 | 11/2002 | Spitzer et al. |
| 7,986,549 | B1 | 7/2011 | Tang et al. |
| 8,605,531 | B2 | 12/2013 | Kau |
| 9,299,411 | B2 | 3/2016 | Alam et al. |
| 9,484,097 | B2 * | 11/2016 | Kim ..................... G11C 11/5628 |
| 9,754,647 | B2 * | 9/2017 | Lee ........................... G11C 7/14 |
| 9,754,997 | B2 * | 9/2017 | Johnson .............. G11C 11/1673 |
| 9,865,338 | B2 * | 1/2018 | Hara ...................... G11C 16/10 |
| 10,153,043 | B2 * | 12/2018 | Tanzawa ............ G11C 16/0483 |
| 10,199,111 | B1 * | 2/2019 | Besinga ................. G11C 16/28 |
| 2003/0198086 | A1 * | 10/2003 | Shukuri ................. B82Y 10/00 365/185.18 |
| 2006/0262628 | A1 * | 11/2006 | Nii ......................... G11C 5/063 365/226 |
| 2011/0260228 | A1 * | 10/2011 | Kawashima ........ H01L 29/4234 257/298 |
| 2015/0001654 | A1 * | 1/2015 | Sandhu ................... H01L 43/02 257/421 |

(Continued)

FOREIGN PATENT DOCUMENTS

| JP | H09-260743 A | 10/1997 |
| JP | 2004-507885 A | 3/2004 |
| JP | 3585629 B2 | 11/2004 |

*Primary Examiner* — Michael T Tran
(74) *Attorney, Agent, or Firm* — Foley & Lardner LLP (57) ABSTRACT

In one embodiment, a device includes a memory cell for storing "0" or "1" as stored data, and a control circuit for reading out the stored data. The memory cell includes area C1/C3 where a cell current increases as a voltage across the cell increases, area C2/C4 where the current is larger than that in C1/C3 and the voltage decreases while the current increases, and area C5 where the current is larger than that in C2/C4 and increases as the voltage increases. The control circuit performs first processing of reading out the stored data such that the current when the data is "0" and the current when the data is "1" take values in C1/C3, and second processing of reading out the stored data such that the current when the data is "0" or the current when the data is "1" takes a value in C2/C4 or C5.

20 Claims, 7 Drawing Sheets

(56) References Cited

U.S. PATENT DOCUMENTS

| | | | |
|---|---|---|---|
| 2015/0123186 A1* | 5/2015 | Ho | H01L 27/11521 |
| | | | 257/316 |
| 2015/0263725 A1* | 9/2015 | Onuki | H03K 17/687 |
| | | | 327/108 |
| 2016/0111148 A1* | 4/2016 | Wong | G11C 11/5628 |
| | | | 365/185.03 |
| 2016/0240774 A1* | 8/2016 | Masuoka | H01L 45/06 |
| 2017/0053697 A1* | 2/2017 | Katou | G11C 13/004 |
| 2017/0084341 A1* | 3/2017 | Lee | G11C 16/26 |
| 2017/0092653 A1* | 3/2017 | Ho | H01L 21/28273 |
| 2017/0179138 A1* | 6/2017 | Hsu | H01L 27/11206 |
| 2017/0194056 A1* | 7/2017 | Heinrich-Barna | |
| | | | G11C 16/3427 |
| 2017/0229179 A1* | 8/2017 | Sugahara | G11C 14/0081 |
| 2017/0271574 A1* | 9/2017 | Inokuchi | G11C 11/161 |
| 2017/0358742 A1* | 12/2017 | Govoreanu | H01L 27/249 |
| 2018/0033483 A1* | 2/2018 | Bertin | B82Y 10/00 |
| 2018/0076206 A1* | 3/2018 | Yoshitomi | H01L 29/42344 |
| 2018/0130539 A1* | 5/2018 | Ikeda | G11C 16/10 |

\* cited by examiner

SEMICONDUCTOR MEMORY DEVICE AND METHOD OF CONTROLLING THE SAME

CROSS REFERENCE TO RELATED APPLICATION

This application is based upon and claims the benefit of priority from the prior Japanese Patent Application No. 2018-053060, filed on Mar. 20, 2018, the entire contents of which are incorporated herein by reference.

FIELD

Embodiments described herein relate to a semiconductor memory device and a method of controlling the same.

BACKGROUND

In recent years, research and development of various semiconductor memory devices such as a PCM (phase-change memory), an ReRAM (resistive random access memory) and an MRAM (magnetoresistive random access memory) have been advanced. Regarding reading data from a memory cell in a semiconductor memory device, there are various demands such as a demand for reading out the data at high speed and a demand for safely reading out the data. Accordingly, there is a problem how to implement appropriate data reading to meet the demands.

BRIEF DESCRIPTION OF THE DRAWINGS

FIGS. 3A to 4B are graphs for describing operations of the semiconductor memory device of the first embodiment;

DETAILED DESCRIPTION

Embodiments will now be explained with reference to the accompanying drawings. In FIG. 1 to FIG. 8D, identical or similar components are assigned the same reference numerals, and hence redundant description is omitted.

In one embodiment, a semiconductor memory device includes a memory cell configured to store a first value or a second value as stored data, and a control circuit configured to read out the first value or the second value as the stored data from the memory cell. The memory cell includes a first operation area where a cell current flowing across the memory cell increases as a voltage across the memory cell increases, a second operation area where the cell current in the second operation area is larger than the cell current in the first operation area and the voltage across the memory cell decreases while the cell current increases, and a third operation area where the cell current in the third operation area is larger than the cell current in the second operation area and the cell current increases as the voltage across the memory cell increases. The control circuit performs first reading processing of reading out the stored data from the memory cell such that the cell current of a case where the stored data has the first value and the cell current of a case where the stored data has the second value respectively take values in the first operation area. The control circuit performs second reading processing of reading out the stored data from the memory cell such that at least one of the cell current in the case where the stored data has the first value and the cell current in the case where the stored data has the second value takes a value in the second operation area or the third operation area.

First Embodiment

Figure 1:
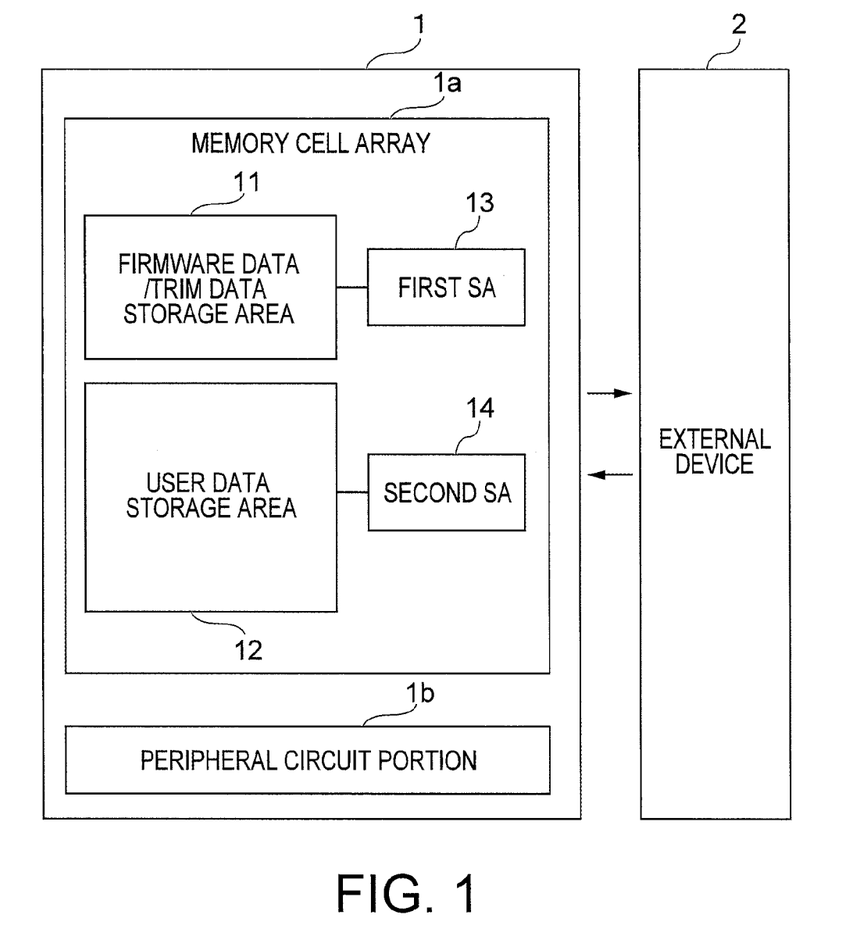
FIG. 1 is a block diagram illustrating a configuration of a semiconductor memory device of a first embodiment.

FIG. 1 is a block diagram illustrating a configuration of a semiconductor memory device 1 of a first embodiment.

FIG. 1 illustrates the semiconductor memory device 1 and an external device 2 that can transmit and receive signals to and from the semiconductor memory device 1. Although a PCM in the present embodiment, the semiconductor memory device may be another semiconductor memory device (e.g., an ReRAM or an MRAM). The external device 2 may be an IC (integrated circuit) that controls an operation of the semiconductor memory device 1 or a PC (personal computer) in or on which the semiconductor memory device 1 is contained or mounted.

The semiconductor memory device 1 includes a memory cell array 1a including a plurality of memory cells and a peripheral circuit portion 1b that performs processing such as control of the memory cell array 1a. The memory cell array 1a has a cross-point structure including memory cells, respectively, at points where a plurality of word lines and a plurality of bit lines intersect each other. The peripheral circuit portion 1b performs processing such as writing data into the memory cells, reading data from the memory cells, receiving a signal from the external device 2, and transmitting a signal to the external device 2.

The memory cell array 1a includes a firmware data/trim data (FD/TD) storage area 11, a user data (UD) storage area 12, a first sense amplifier (SA) 13, and a second sense amplifier (SA) 14.

The FD/TD storage area 11 is a storage area including a memory cell which stores data (firmware data) for a basic operation of the external device 2 and a memory cell which stores data (trim data) for a basic operation of the peripheral circuit portion 1b. The UD storage area 12 is a storage area including a memory cell for a user of the semiconductor memory device 1 to store data (user data).

The first SA 13 and the second SA 14 each transfers read data, which has been received from a memory cell, to the external device 2 via the peripheral circuit portion 1b and transfers write data, which has been received from the external device 2 via the peripheral circuit portion 1b, to a memory cell. The first SA 13 is provided to handle the firmware data and the trim data, and the second SA 14 is provided to handle the user data. The first SA 13, the second SA 14, and the peripheral circuit portion 1b are each an example of a control circuit.

Figure 2:
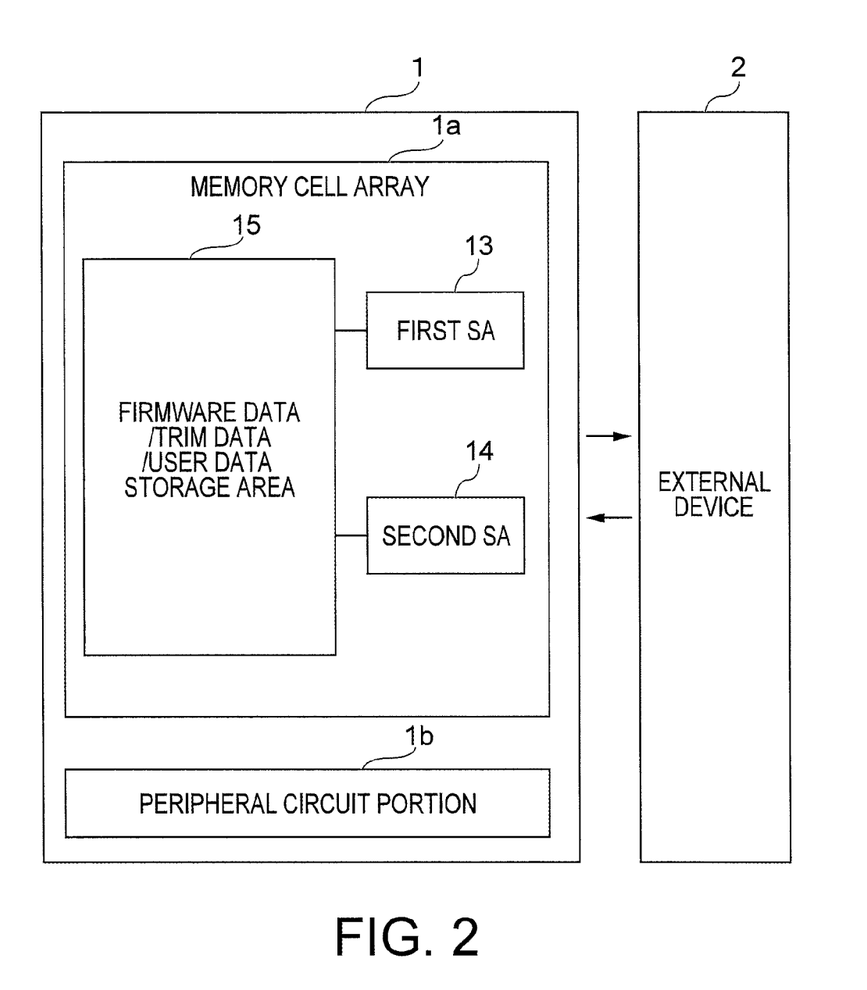
FIG. 2 is a block diagram illustrating a configuration of a semiconductor memory device of a modification to the first embodiment.

FIG. 2 is a block diagram illustrating a configuration of a semiconductor memory device 1 of a modification to the first embodiment.

The semiconductor memory device 1 of the modification includes a firmware data/trim data/user data (FD/TD/UD)

storage area 15 instead of the FD/TD storage area 11 and the UD storage area 12. In the modification, a storage area for firmware data and trim data and a storage area for user data are not separated from each other, and all the firmware data, the trim data, and the user data are stored in the FD/TD/UD storage area 15.

Although details of the semiconductor memory device 1 illustrated in FIG. 1 will be described below, the following description is also applicable to the semiconductor memory device 1 illustrated in FIG. 2.

FIGS. 3A to 4B are graphs for describing an operation of the semiconductor memory device 1 of the first embodiment.

In FIGS. 3A to 4B, a horizontal axis represents an applied voltage applied to each of the memory cells in the semiconductor memory device 1, and a vertical axis represents a cell current flowing through each of the memory cells in the semiconductor memory device 1. When the voltage represented by the horizontal axis is applied between terminals of any one of the memory cells, the cell current represented by the vertical axis flows from one of the terminals to the other terminal of the memory cell. When the cell current flowing between the terminals of any one of the memory cells changes, as with the above-described graph, a voltage between the terminals of the memory cell changes, as with the above-described graph.

FIGS. 3A to 4B illustrate four schemes for reading out 0 or 1 as stored data from the memory cell. The stored data "0" is an example of a first value, and indicates that the memory cell is in a high-resistance state, for example. The stored data "1" is an example of a second value, and indicates that the memory cell is in a low-resistive state, for example.

Figure 3A:
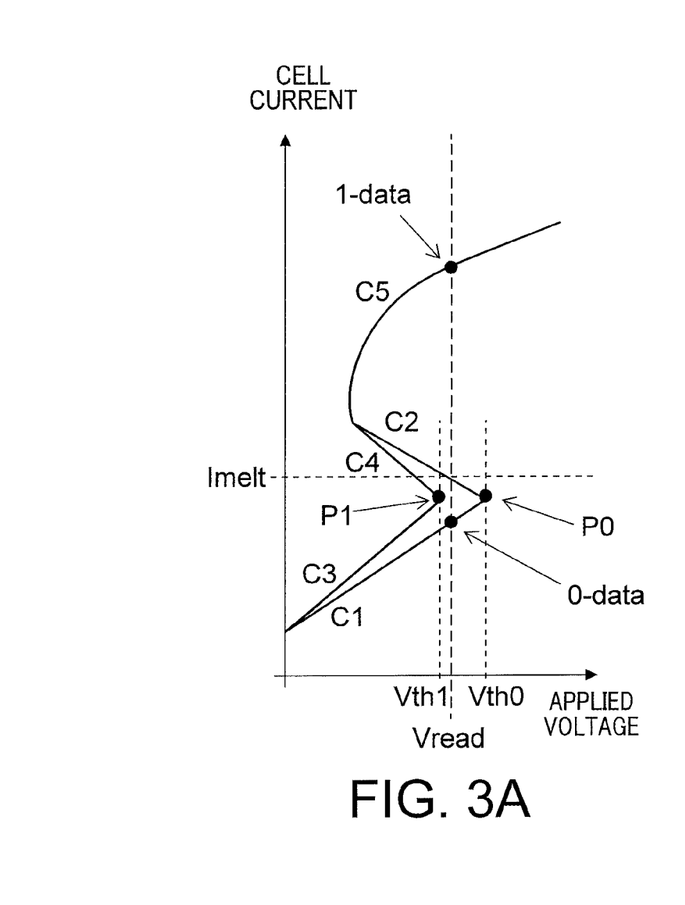
Figure 3B:
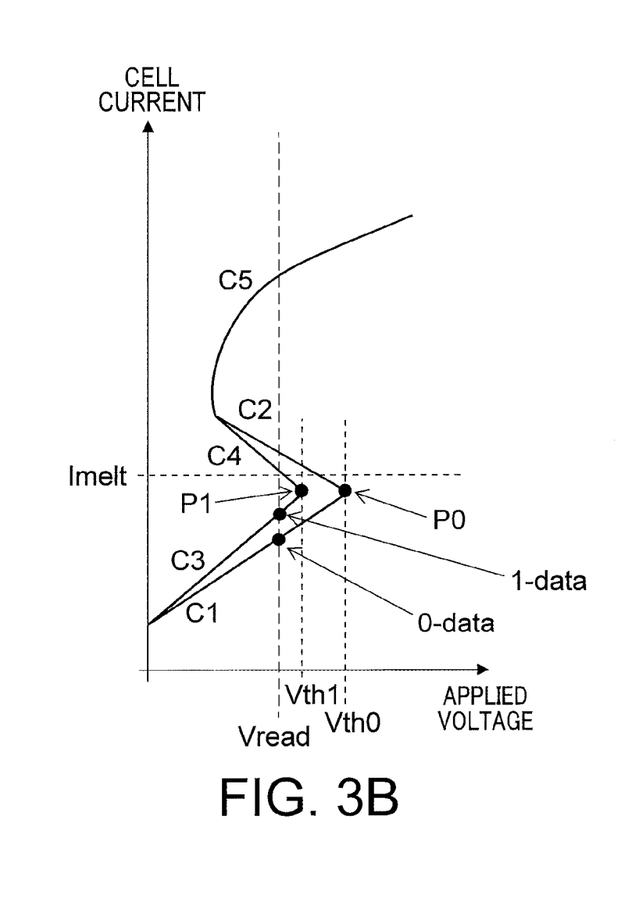

In FIGS. 3A and 3B, a voltage reading scheme has been adopted. More specifically, a read voltage Vread is applied as an applied voltage to the memory cell, and it is determined whether the stored data is 0 or 1 based on the magnitude of a cell current generated depending on the read voltage Vread. In FIG. 3A, the read voltage Vread is applied such that snapback of the memory cell does not occur when the stored data is 0 but occurs if the stored data is 1. On the other hand, in FIG. 3B, the read voltage Vread is applied such that snapback of the memory cell does not occur regardless of whether the stored data is 0 or 1.

Figure 4A:
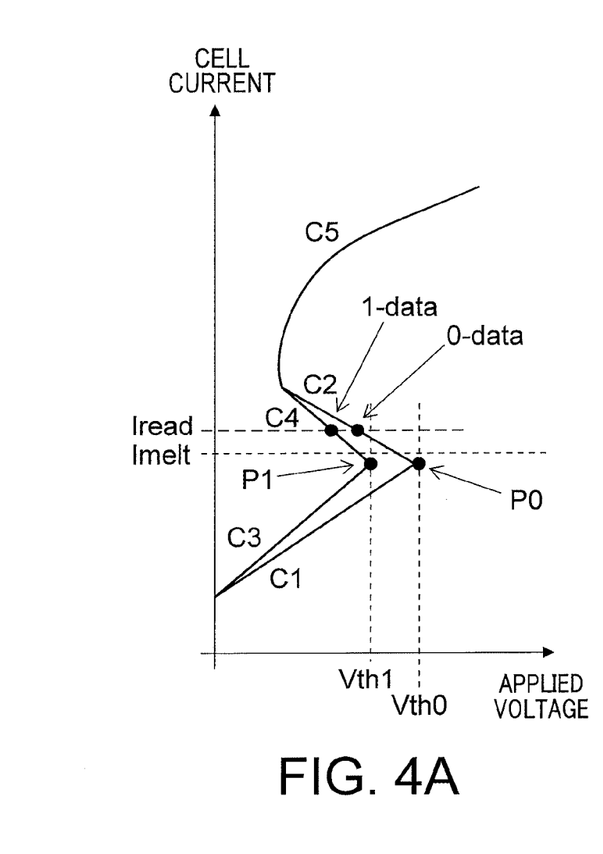
Figure 4B:
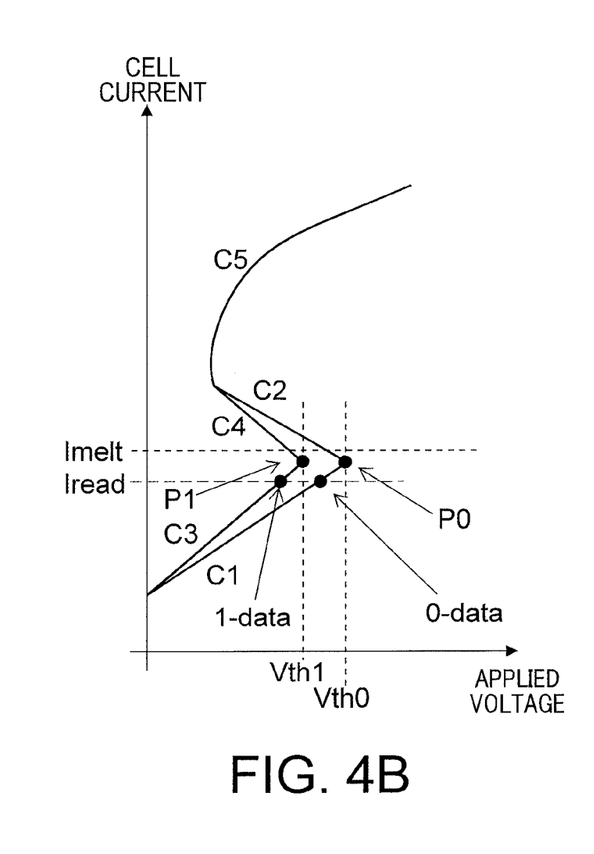

In FIGS. 4A and 4B, a current reading scheme has been adopted. More specifically, an applied voltage is applied such that a read current Iread flows as a cell current through the memory cell, and it is determined whether the stored data is 0 or 1 based on the magnitude of the applied voltage. In FIG. 4A, the read current Iread is caused to flow such that snapback of the memory cell occurs regardless of whether the stored data is 0 or 1. On the other hand, in FIG. 4B, the read current Iread is caused to flow such that snapback of the memory cell does not occur regardless of whether the stored data is 0 or 1.

An operation characteristic and snapback of the memory cell will be described below while mainly referring to FIG. 3A. In the description, FIGS. 3B to 4B will also be referred to, as needed.

As illustrated in FIG. 3A, the memory cell in the present embodiment in case the stored data is 0 includes an operation area C1, an operation area C2 where a cell current is larger than a cell current in the operation area C1, and an operation area C5 where a cell current is larger than the cell current in the operation area C2. Further, the memory cell in the present embodiment in case the stored data is 1 includes an operation area C3, an operation area C4 where a cell current is larger than a cell current in the operation area C3, and the operation area C5 where the cell current is larger than the cell current in the operation area C4. The operation areas C1 and C3 are each an example of a first operation area, the operation areas C2 and C4 are each a second operation area, and the operation area C5 is an example of a third operation area.

In the operation areas C1 and C3, the cell current increases as the applied voltage increases. The cell current in the operation area C3 more steeply increases than the cell current in the operation area C1 in response to the increase in the applied voltage. In the operation areas C2 and C4, the applied voltage decreases while the cell current increases. The applied voltage in the operation area C4 more gently decreases than the applied voltage in the operation area C2 in response to the increase in the cell current. In the operation area C5, the cell current increases as the applied voltage increases. In the operation area C5, the memory cell has the same characteristic regardless of whether the stored data is 0 or 1.

Reference character P0 represents an inflection point between a curve representing the operation area C1 and a curve representing the operation area C2, and reference character Vth0 represents an applied voltage at the inflection point P0. The applied voltage Vth0 is referred to as a threshold voltage (snapback voltage) in a case where the stored data is 0.

Reference character P1 represents an inflection point between a curve representing the operation area C3 and a curve representing the operation area C4, and reference character Vth1 represents an applied voltage at the inflection point P1. The applied voltage Vth1 is referred to as a threshold voltage (snapback voltage) in a case where the stored data is 1.

In the present embodiment, a cell current corresponding to the applied voltage Vth0 and a cell current corresponding to the applied voltage Vth1 have the same magnitude. Hereinafter, the cell current will be each referred to as a snapback current.

The semiconductor memory device of the present embodiment is the PCM. In this case, there occurs a phenomenon that the characteristic of the memory cell changes from a characteristic of the operation area C1 to a characteristic of the operation area C2 at the inflection point P0 and changes from a characteristic of the operation area C3 to a characteristic of the operation area C4 at the inflection point P1. The phenomenon is referred to as snapback. The snapback of the PCM occurs when the characteristic of the memory cell changes with temperature, for example. In a semiconductor memory device other than the PCM, snapback can occur due to another cause.

If the stored data is read out of the memory cell, the larger the cell current is, the higher a speed at which the stored data can be read out becomes. Accordingly, to read out the stored data at high speed, the cell current is desirably larger than the snapback current. That is, to read out the stored data at high speed, the operation areas C2, C4, and C5 are desirably used.

On the other hand, when the cell current larger than the snapback current repeatedly flows through the memory cell, the stored data in the memory cell may be lost. Further, when the cell current becomes larger than Imelt illustrated in FIG. 3A, at least a part of the memory cell is dissolved so that the stored data may be lost. In this case, there is a risk that the stored data cannot be read out again unless the stored data is written again into the memory cell. Accordingly, to safely read out the stored data, the cell current is desirably smaller than the snapback current. That is, to safely read out the stored data, the operation areas C1 and C3 are desirably used.

Accordingly, in FIG. 3A, to read out the stored data at high speed, the read voltage Vread is applied such that snapback of the memory cell does not occur if the stored data is 0 but occurs if the stored data is 1. If the stored data is 0, only the cell current in the operation area C1 smaller than the snapback current flows. However, if the stored data is 1, the cell current in the operation area C5 larger than the snapback current flows. The reading is an example of second reading processing.

On the other hand, in FIG. 3B, to safely read out the stored data, the read voltage Vread is applied such that snapback of the memory cell does not occur regardless of whether the stored data is 0 or 1. If the stored data is 0, the cell current in the operation area C1 smaller than the snapback current flows. If the stored data is 1, the cell current in the operation area C3 smaller than the snapback current flows. The reading is an example of first reading processing.

For reading stored data from one memory cell, a time period taken to read out the stored data in FIG. 3A becomes shorter than a time period taken to read out the stored data in FIG. 3B. That is, according to the method illustrated in FIG. 3A, high-speed reading can be performed. On the other hand, according to the method illustrated in FIG. 3B, safe reading can be performed.

Similarly, in FIG. 4A, to read out the stored data at high speed, the read current Iread is caused to flow such that snapback of the memory cell occurs regardless of whether the stored data is 0 or 1. If the stored data is 0, the cell current in the operation area C2 larger than the snapback current flows. If the stored data is 1, the cell current in the operation area C4 larger than the snapback current flows. The reading is an example of second reading processing.

On the other hand, in FIG. 4B, to safely read out the stored data, the read current Iread is caused to flow such that snapback of the memory cell does not occur regardless of whether the stored data is 0 or 1. If the stored data is 0, the cell current in the operation area C1 smaller than the snapback current flows. If the stored data is 1, the cell current in the operation area C3 smaller than the snapback current flows. The reading is an example of first reading processing.

For reading stored data from one memory cell, a time period taken to read out the stored data in FIG. 4A becomes shorter than a time period taken to read out the stored data in FIG. 4B. That is, according to the method illustrated in FIG. 4A, high-speed reading can be performed. On the other hand, according to the method illustrated in FIG. 4B, safe reading can be performed.

The first SA 13, the second SA 14, and the peripheral circuit portion 1b in the present embodiment are configured to be able to perform both the first reading processing and the second reading processing. For example, the second reading processing is performed if the stored data needs to be read out at high speed, and the first reading processing is performed when the stored data needs to be safely read out. Accordingly, according to the present embodiment, the stored data can also be read out at high speed and read out safely so that the stored data can be appropriately read out of each of the memory cells.

In the present embodiment, either the processing illustrated in FIG. 3B or the processing illustrated in FIG. 4B may be adopted as the first reading processing, and either the processing illustrated in FIG. 3A or the processing illustrated in FIG. 4A may be adopted as the second reading processing. For example, it is considered that the firmware data and the trim data are safely read out by the first reading processing (the current reading scheme) illustrated in FIG. 4B and the user data is read out at high speed by the second reading processing (the voltage reading scheme) illustrated in FIG. 3A. The reason is that the firmware data and the trim data are undesirably lost while the user data is desirably read out at high speed. Application of the first and second reading processing to the firmware data, the trim data, and the user data will be described in more detail below.

As described above, in the first reading processing illustrated in FIGS. 3B and 4B, the stored data is read out of the memory cell such that the cell current takes respective values in the operation areas C1 and C3 regardless of whether the stored data is 0 or 1. On the other hand, in the second reading processing illustrated in FIG. 3A and FIG. 4A, the stored data is read out of the memory cell such that the cell current of a case where the stored data is 0 and/or 1 takes respective values in the operation areas C2, C4, and C5. As a result, the stored data can be favorably read out of each of the memory cells in consideration of high speed and safety.

Figure 5A:
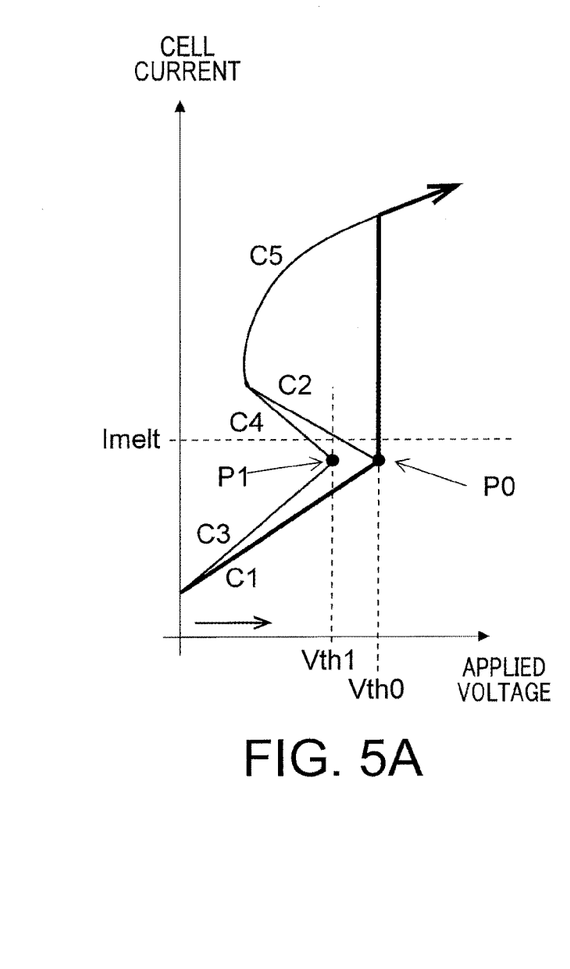
FIGS. 5A and 5B are graphs for detailed description of FIGS. 3A to 4B.
Figure 5B:
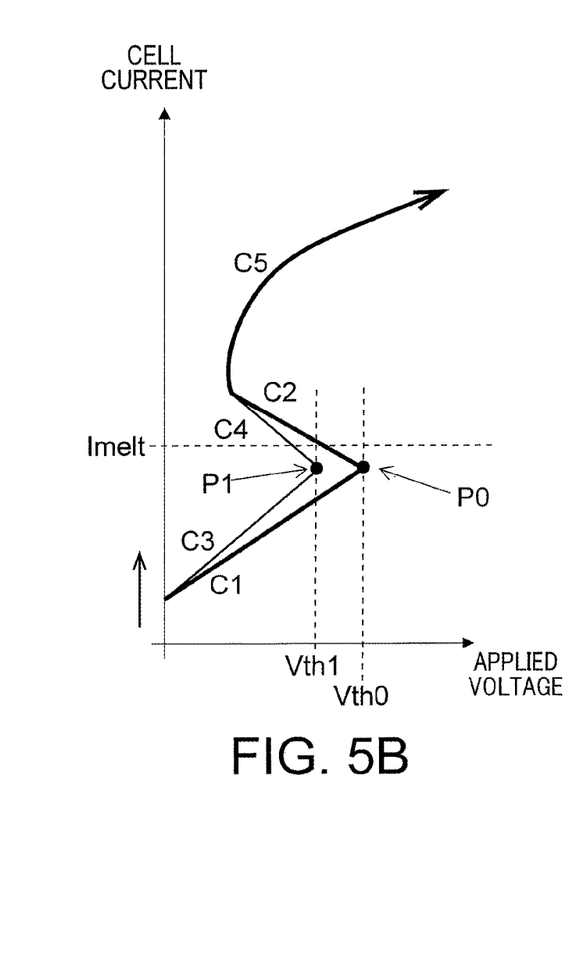

FIGS. 5A and 5B are graphs for detailed description of FIGS. 3A to 4B.

In FIG. 5A, a change of the cell current of a case where the applied voltage is gradually increased when the stored data "0" is read out using the voltage reading scheme is indicated by a thick line. Note that the characteristic of the memory cell changes from the operation area C1 to the operation area C5 when the applied voltage becomes higher than the snapback voltage Vth0. The same is true when the stored data "1" is read out using the voltage reading scheme.

In FIG. 5B, a change of the applied voltage in a case where the cell current is gradually increased when the stored data "0" is read out using the current reading scheme is indicated by a thick line. Note that the characteristic of the memory cell changes from the operation area C1 to the operation area C5 via the operation area C2. The same is true when the stored data "1" is read out using the current reading scheme.

Figure 6A:
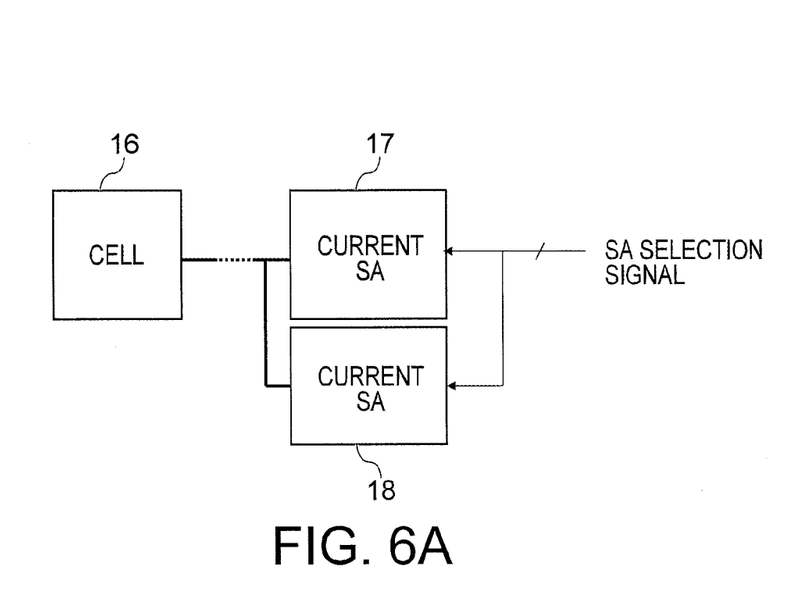
FIGS. 6A and 6B are block diagrams illustrating examples of the configuration of the semiconductor memory device of the first embodiment.
Figure 6B:
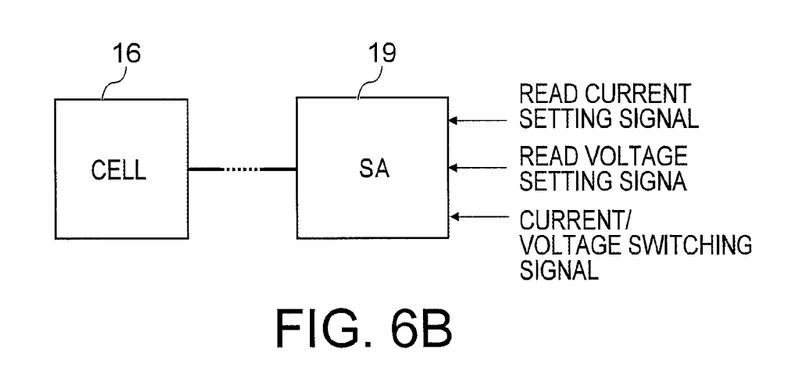

FIGS. 6A and 6B are block diagrams illustrating examples of the configuration of the semiconductor memory device 1 of the first embodiment.

FIG. 6A illustrates a memory cell 16, a current SA 17, and a voltage SA 18 in the memory cell array 1a. In an example illustrated in FIG. 6A, each of the first SA 13 and the second SA 14 includes the current SA 17 and the voltage SA 18.

The current SA 17 is a sense amplifier for the current reading scheme illustrated in FIG. 4A or 4B, and an applied voltage is applied such that a read current Iread flows through the memory cell 16. The peripheral circuit portion 1b can read stored data in the memory cell 16 based on the applied voltage. The read current Iread is an example of a cell current having a predetermined value.

The voltage SA 18 is a sense amplifier for the voltage reading scheme illustrated in FIG. 3A or 3B, and a read voltage Vread is applied to the memory cell 16. The peripheral circuit portion 1b can read stored data in the memory cell 16 based on a cell current generated in response to the read voltage Vread. The read voltage Vread is an example of an applied voltage having a predetermined value.

The current SA 17 and the voltage SA 18 each receive an SA selection signal from the peripheral circuit portion 1b. If the SA selection signal includes an instruction to select the current SA 17, the current SA 17 operates, to perform reading using the current reading scheme. If the SA selection signal includes the instruction to select the voltage SA 18, the voltage SA 18 operates, to perform reading using the voltage reading scheme.

Suppose a case where firmware data and trim data are read out using the current reading scheme illustrated in FIG. 4B, and user data is read out using the voltage reading scheme illustrated in FIG. 3A. In this case, the first SA 13 may include only the current SA 17, and the second SA 14 may include only the voltage SA 18. The former current SA 17 executes the current reading scheme illustrated in FIG. 4B, and the latter voltage SA 18 executes the voltage reading scheme illustrated in FIG. 3A.

FIG. 6B illustrates a memory cell 16 and an SA 19 in the memory cell array 1*a*. In an example illustrated in FIG. 6B, each of the first SA 13 and the second SA 14 includes the SA 19.

The SA 19 is a sense amplifier capable of executing both the current reading scheme illustrated in FIG. 4A or 4B and the voltage reading scheme illustrated in FIG. 3A or 3B. If the SA 19 applies a read voltage Vread to the memory cell 16, the peripheral circuit portion 1*b* can read stored data in the memory cell 16 based on a cell current generated in response to the read voltage Vread. If the SA 19 applies an applied voltage to the memory cell 16 such that a read current Iread flows through the memory cell 16, the peripheral circuit portion 1*b* can read stored data in the memory cell 16 based on this applied voltage.

The SA 19 receives a read current setting signal, a read voltage setting signal, and/or a current/voltage switching signal from the peripheral circuit portion 1*b*. The read current setting signal is a signal for setting a value of the read current Iread. The read voltage setting signal is a signal for setting a value of the read voltage Vread. The current/voltage switching signal is a signal for issuing an instruction as to which of the current reading scheme and the voltage reading scheme is to be executed. The SA 19 performs reading using the current reading scheme when it receives the current/voltage switching signal for issuing an instruction to execute the current reading scheme and performs reading using the voltage reading scheme when it receives the current/voltage switching signal for issuing an instruction to execute the voltage reading scheme.

FIGS. 7A to 7D are diagrams illustrating examples of operations of the semiconductor memory device 1 of the first embodiment.

Figure 7A:
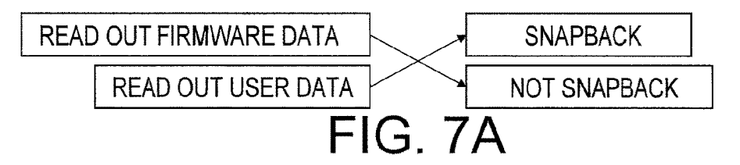
FIGS. 7A to 7D are diagrams illustrating examples of operations of the semiconductor memory device of the first embodiment.

In an example illustrated in FIG. 7A, firmware data is read out such that snapback does not occur at the time of reading out 0 and 1 by the first reading processing illustrated in FIG. 3B or 4B. On the other hand, user data is read out such that snapback occurs at the time of reading out 0 and/or 1 by the second reading processing illustrated in FIG. 3A or 4A.

The firmware data is data required when the external device 2 is started, for example. In this case, reading involving a risk that the firmware data cannot be correctly read out of the memory cell or the firmware data within the memory cell is lost, for example, is not desirable. Therefore, in this example, the firmware data is read out by safe first reading processing.

Figure 7B:
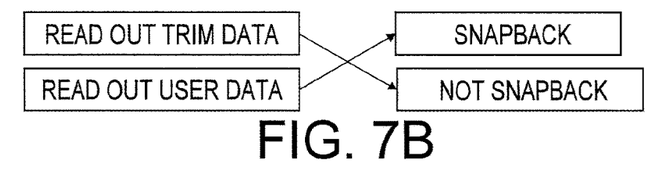

In an example illustrated in FIG. 7B, trim data is read out such that snapback does not occur at the time of reading out 0 and 1 by the first reading processing illustrated in FIG. 3B or 4B. On the other hand, user data is read out such that snapback occurs at the time of reading out 0 and/or 1 by the second reading processing illustrated in FIG. 3A or 4A.

An example of the trim data is data relating to a redundant cell in the memory cell array 1*a*. In this case, reading involving a risk that the trim data cannot be correctly read out of the memory cell or the trim data within the memory cell is lost, for example, is not desirable. Therefore, in this example, the trim data is read out by safe first reading processing.

Figure 7C:
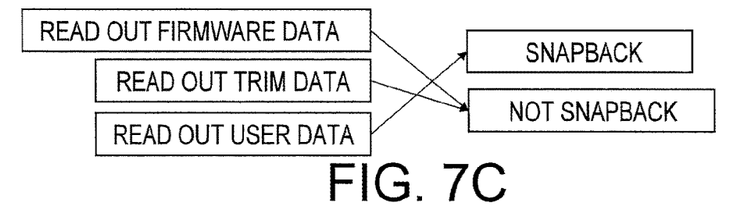

In an example illustrated in FIG. 7C, firmware data and trim data are read out such that snapback does not occur at the time of reading out 0 and 1 by the first reading processing illustrated in FIG. 3B or FIG. 4B. On the other hand, user data is read out such that snapback occurs at the time of reading out 0 and/or 1 by the second reading processing illustrated in FIG. 3A or 4A.

Figure 7D:
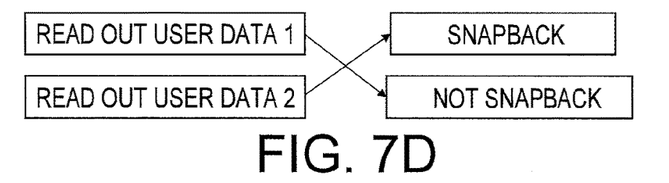

In an example illustrated in FIG. 7D, if user data is read out of the memory cell within a certain address area in the UD storage area 12, the user data is read out such that snapback does not occur at the time of reading out 0 and 1 by the first reading processing illustrated in FIG. 3B or FIG. 4B. On the other hand, if user data is read out of the memory cell within another address area in the UD storage area 12, the user data is read out such that snapback occurs at the time of reading out 0 and/or 1 by the second reading processing illustrated in FIG. 3A or 4A. The former address area is an example of a first address area, and the latter address area is an example of a second address area different from the first address area. This example can be adopted when a reading speed, an error rate, and reliability required differ for each of the memory cells in the UD storage area 12. This example may be applied to both the FD/TD storage area 11 and the UD storage area 12. In this case, all address areas within the FD/TD storage area 11 may be considered as the first address area.

FIGS. 8A to 8D are schematic views illustrating examples of the configuration of the semiconductor memory device 1 of the first embodiment. FIGS. 8A to 8D respectively illustrate various examples of one memory cell in the present embodiment.

Figure 8A:
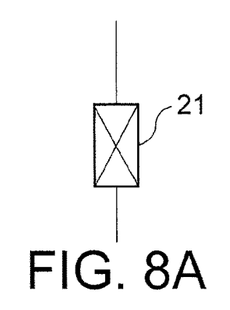
FIGS. 8A to 8D are schematic views illustrating examples of the configuration of the semiconductor memory device of the first embodiment.

The memory cell illustrated in FIG. 8A includes only a storage element 21. The storage element 21 has a function of storing 0 or 1 as stored data. A threshold voltage of the storage element 21 changes to a value like Vth0 and Vth1, described above, depending on the stored data. In the example illustrated in FIG. 8A, snapback, which differs depending on whether the stored data is 0 or 1, is implemented by the storage element 21. More specifically, the storage element 21 includes operation areas C1, C2, and C5 if the stored data is 0 and includes operation areas C3, C4, and C5 if the stored data is 1.

Figure 8B:
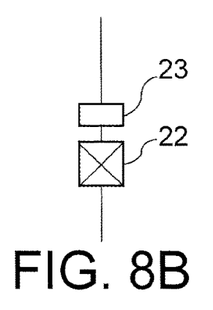

The memory cell illustrated in FIG. 8B includes a storage element 22 and a nonlinear element 23 which are connected in series. The storage element 22 has a function of storing 0 or 1 as stored data. An example of the storage element 22 is an element which changes in resistance depending on the stored data. The nonlinear element 23 has a nonlinear I-V characteristic (current-voltage characteristic). An example of the nonlinear element 23 is an element which greatly changes in a current flowing through the nonlinear element 23 depending on a voltage to be applied to the nonlinear element 23. In the example illustrated in FIG. 8B, snapback, which differs depending on whether the stored data is 0 or 1, is implemented by the storage element 22 and the nonlinear element 23.

In the example illustrated in FIG. 8B, the nonlinear element 23 may be replaced with a diode, and a threshold voltage of the storage element 22 may change depending on the stored data.

Figure 8C:
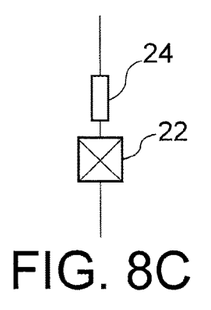

The memory cell illustrated in FIG. 8C includes a storage element 22 and a snapback element 24 which are connected in series. The storage element 22 has a function of storing 0 or 1 as stored data. An example of the storage element 22 is an element which changes in resistance depending on the stored data. The snapback element 24 has an I-V characteristic including snapback. The I-V characteristic of the snapback element 24 is the same regardless of whether the stored data in the storage element 22 is 0 or 1. In the example illustrated in FIG. 8C, snapback, which differs depending on whether the stored data is 0 or 1, is implemented by the storage element 22 and the snapback element 24.

In the example illustrated in FIG. 8C, the snapback element 24 may be replaced with a select element for selecting a memory cell, and a threshold voltage of the storage element 22 may change depending on the stored data.

Figure 8D:
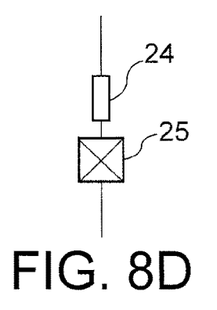

The memory cell illustrated in FIG. 8D includes a storage element 25 and a snapback element 24 which are connected in series. The storage element 25 has a function of storing 0 or 1 as stored data. The storage element 25 has an I-V characteristic including snapback. The I-V characteristic of the storage element 25 differs depending on whether the stored data in the storage element 22 is 0 or 1. On the other hand, the snapback element 24 has an I-V characteristic including snapback. However, the I-V characteristic of the snapback element 24 is the same regardless of whether the stored data in the storage element 22 is 0 or 1. In the example illustrated in FIG. 8D, snapback, which differs depending on whether the stored data is 0 or 1, is implemented by only the storage element 25. However, the snapback element 24 has a function of changing the snapback.

In the example illustrated in FIG. 8D, the snapback element 24 may be replaced with a select element for selecting a memory cell.

Each of the memory cells in the present embodiment is arranged at a point where one word line and one bit line intersect each other, for example. In this case, the storage element 22 and the nonlinear element 23 illustrated in FIG. 8B are connected in series between the word line and the bit line, and an applied voltage is the sum of a voltage applied to the storage element 22 and a voltage applied to the nonlinear element 23. The same is true in cases illustrated in FIGS. 8C and 8D.

As described above, the semiconductor memory device 1 of the present embodiment reads out the stored data from the memory cell by the first and second reading processing. In the first reading processing, the stored data is read out of the memory cell such that the cell current takes the respective values in the operation areas C1 and C3 regardless of whether the stored data is 0 or 1. In the second reading processing, the stored data is read out of the memory cell such that the cell current of a case where the stored data is 0 and/or 1 takes the respective values in the operation areas C2, C4, and C5.

As described above, according to the present embodiment, when the first reading processing and the second reading processing are differently used in consideration of high speed and safety of reading, for example, the stored data can be appropriately read out of each of the memory cells.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
   a memory cell configured to store a first value or a second value as stored data; and
   a control circuit configured to read out the first value or the second value as the stored data from the memory cell,
   wherein
   the memory cell comprises:
   a first operation area where a cell current flowing across the memory cell increases as a voltage across the memory cell increases,
   a second operation area where the cell current in the second operation area is larger than the cell current in the first operation area and the voltage across the memory cell decreases while the cell current increases, and
   a third operation area where the cell current in the third operation area is larger than the cell current in the second operation area and the cell current increases as the voltage across the memory cell increases,
   the control circuit performs:
   first reading processing of reading out the stored data from the memory cell such that the cell current of a case where the stored data has the first value and the cell current of a case where the stored data has the second value respectively take values in the first operation area, and
   second reading processing of reading out the stored data from the memory cell such that at least one of the cell current in the case where the stored data has the first value and the cell current in the case where the stored data has the second value takes a value in the second operation area or the third operation area.

2. The device of claim 1, wherein
   the cell current in the case where the stored data has the second value increases more steeply than the cell current in the case where the stored data has the first value in the first operation area, and
   the cell current in the case where the stored data has the second value decreases more steeply than the cell current in the case where the stored data has the first value in the second operation area.

3. The device of claim 1, wherein a time period taken to read out the stored data by the second reading processing differs from a time period taken to read out the stored data by the first reading processing.

4. The device of claim 1, wherein the control circuit reads out the stored data by applying the voltage having a predetermined value to the memory cell or by causing the cell current having a predetermined value to flow through the memory cell.

5. The device of claim 4, wherein the control circuit includes a voltage sense amplifier configured to apply the voltage having the predetermined value to the memory cell, and a current sense amplifier configured to cause the cell current having the predetermined value to flow through the memory cell.

6. The device of claim 4, wherein the control circuit includes a sense amplifier configured to apply the voltage having the predetermined value to the memory cell when the sense amplifier receives a signal for issuing an instruction to apply the voltage having the predetermined value, and to cause the cell current having the predetermined value to flow through the memory cell when the sense amplifier receives a signal for issuing an instruction to cause the cell current having the predetermined value to flow.

7. The device of claim 1, wherein the control circuit reads out firmware data or trim data from the memory cell by the first reading processing.

8. The device of claim 1, wherein the control circuit performs the first reading processing when the control circuit reads out the stored data from the memory cell in a first address area, and performs the second reading processing when the control circuit reads out the stored data from the memory cell in a second address area different from the first address area.

9. The device of claim 1, wherein the memory cell includes a first element configured to store the stored data and a second element connected in series with the first element, and the first, second and third operation areas occur due to characteristics of the first element and/or the second element.

10. The device of claim 9, wherein the second element is a nonlinear element having a nonlinear current-voltage characteristic, a diode, a snapback element having a current-voltage characteristic including snapback, or a select element configured to select the first element.

11. A method of controlling a semiconductor memory device, comprising:
storing a first value or a second value as stored data in a memory cell that includes a first operation area where a cell current flowing across the memory cell increases as a voltage across the memory cell increases, a second operation area where the cell current in the second operation area is larger than the cell current in the first operation area and the voltage across the memory cell decreases while the cell current increases, and a third operation area where the cell current in the third operation area is larger than the cell current in the second operation area and the cell current increases as the voltage across the memory cell increases,
performing first reading processing of reading out the stored data from the memory cell such that the cell current of a case where the stored data has the first value and the cell current of a case where the stored data has the second value respectively take values in the first operation area, and
performing second reading processing of reading out the stored data from the memory cell such that at least one of the cell current in the case where the stored data has the first value and the cell current in the case where the stored data has the second value takes a value in the second operation area or the third operation area.

12. The method of claim 11, wherein
the cell current in the case where the stored data has the second value increases more steeply than the cell current in the case where the stored data has the first value in the first operation area, and
the cell current in the case where the stored data has the second value decreases more steeply than the cell current in the case where the stored data has the first value in the second operation area.

13. The method of claim 11, wherein a time period taken to read out the stored data by the second reading processing differs from a time period taken to read out the stored data by the first reading processing.

14. The method of claim 11, wherein a control circuit configured to perform the first reading processing and the second reading processing reads out the stored data by applying the voltage having a predetermined value to the memory cell, or by causing the cell current having a predetermined value to flow through the memory cell.

15. The method of claim 14, wherein the control circuit includes a voltage sense amplifier that applies the voltage having the predetermined value to the memory cell, and a current sense amplifier that causes the cell current having the predetermined value to flow through the memory cell.

16. The method of claim 14, wherein the control circuit includes a sense amplifier that applies the voltage having the predetermined value to the memory cell when the sense amplifier receives a signal for issuing an instruction to apply the voltage having the predetermined value, and causes the cell current having the predetermined value to flow through the memory cell when the sense amplifier receives a signal for issuing an instruction to cause the cell current having the predetermined value to flow.

17. The method of claim 11, wherein firmware data or trim data is read out of the memory cell by the first reading processing.

18. The method of claim 11, wherein the first reading processing is performed when the stored data is read out of the memory cell in a first address area, and the second reading processing is performed when the stored data is read out of the memory cell in a second address area different from the first address area.

19. The method of claim 11, wherein the memory cell includes a first element configured to store the stored data and a second element connected in series with the first element, and the first, second and third operation areas occur due to characteristics of the first element and/or the second element.

20. The method of claim 19, wherein the second element is a nonlinear element having a nonlinear current-voltage characteristic, a diode, a snapback element having a current-voltage characteristic including snapback, or a select element configured to select the first element.

* * * * *